(12) United States Patent
Kim et al.

(10) Patent No.: US 8,759,798 B2
(45) Date of Patent: Jun. 24, 2014

(54) ION IMPLANTATION SYSTEM AND ION IMPLANTATION METHOD USING THE SAME

(75) Inventors: Hyun-Gue Kim, Yongin (KR); Sang-Soo Kim, Yongin (KR)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 143 days.

(21) Appl. No.: 13/236,985

(22) Filed: Sep. 20, 2011

(65) Prior Publication Data

US 2012/0100703 A1    Apr. 26, 2012

(30) Foreign Application Priority Data

Oct. 21, 2010  (KR) ........................ 10-2010-0103059

(51) Int. Cl.
*H01J 37/20* (2006.01)
*H01J 37/08* (2006.01)

(52) U.S. Cl.
USPC .................................................... 250/492.21

(58) Field of Classification Search
USPC .................................................... 250/492.21
See application file for complete search history.

(56) References Cited

U.S. PATENT DOCUMENTS

| | | | | |
|---|---|---|---|---|
| 1,779,963 A * | 10/1930 | Corby et al. | ................... | 432/150 |
| 4,187,124 A * | 2/1980 | Muller et al. | ................... | 438/62 |
| 4,578,589 A * | 3/1986 | Aitken | ........................ | 250/492.2 |
| 4,693,777 A * | 9/1987 | Hazano et al. | ............ | 156/345.31 |
| 5,003,183 A * | 3/1991 | Nogami et al. | ............. | 250/492.2 |
| 5,134,301 A * | 7/1992 | Kamata et al. | ............. | 250/492.2 |
| 5,236,509 A * | 8/1993 | Sioshansi et al. | ............. | 118/719 |
| 5,311,028 A * | 5/1994 | Glavish | ..................... | 250/492.21 |
| 5,350,926 A * | 9/1994 | White et al. | .............. | 250/492.21 |
| 5,541,138 A * | 7/1996 | Yamazaki et al. | ............ | 438/535 |
| 5,554,854 A * | 9/1996 | Blake | ........................ | 250/492.21 |
| 5,863,712 A * | 1/1999 | Von Bunau et al. | .......... | 430/396 |
| 5,929,456 A * | 7/1999 | Tamai | ........................ | 250/492.21 |
| 5,932,883 A * | 8/1999 | Hashimoto et al. | ...... | 250/492.21 |
| 6,092,485 A * | 7/2000 | Ando et al. | .............. | 118/723 VE |
| 6,207,005 B1 | 3/2001 | Henley et al. | | |
| 6,213,050 B1 * | 4/2001 | Liu et al. | ................... | 118/723 IR |
| 6,670,621 B2 * | 12/2003 | Chen | ......................... | 250/492.2 |

(Continued)

FOREIGN PATENT DOCUMENTS

| | | |
|---|---|---|
| JP | 2002-176090 | 6/2002 |
| KR | 1020000049709 A | 8/2000 |

(Continued)

*Primary Examiner* — Jack Berman
*Assistant Examiner* — Sean Luck
(74) *Attorney, Agent, or Firm* — Robert E. Bushnell, Esq.

(57) ABSTRACT

According to the present invention, an ion implantation system capable of implanting ions into a large substrate and reducing a manufacturing cost, and an ion implantation method using the same may be provided. The ion implantation system includes a plurality of ion implantation assemblies arranged in a line, each ion implantation assembly to implant ions into a partial region of the substrate. This allows for a compact ion implantation system to implant ions into a very large substrate. The substrate moves through the ion implantation system in a first direction, turns around, and then moves back through the ion implantation system in a second and opposite direction, where ions are implanted into the substrate while the substrate is moving in both directions. The path in the first direction can be spaced-apart from the path in the second direction to allow for two substrates to be processed simultaneously.

36 Claims, 6 Drawing Sheets

(56) References Cited

U.S. PATENT DOCUMENTS

| | | | |
|---|---|---|---|
| 6,777,699 B1* | 8/2004 | Miley et al. | 250/492.3 |
| 7,271,400 B1* | 9/2007 | Shaban et al. | 250/492.3 |
| 7,375,355 B2 | 5/2008 | Ferrara et al. | |
| 7,566,886 B2 | 7/2009 | Eisner et al. | |
| 7,626,184 B2 | 12/2009 | Mizuno et al. | |
| 8,330,128 B2* | 12/2012 | Vopat et al. | 250/492.22 |
| 2002/0014597 A1* | 2/2002 | Koh et al. | 250/492.21 |
| 2002/0027205 A1* | 3/2002 | Liu et al. | 250/492.21 |
| 2002/0028399 A1* | 3/2002 | Nakasuji et al. | 430/30 |
| 2003/0190419 A1* | 10/2003 | Katagami et al. | 427/240 |
| 2004/0096586 A1* | 5/2004 | Schulberg et al. | 427/372.2 |
| 2005/0211926 A1* | 9/2005 | Ito et al. | 250/492.21 |
| 2005/0214958 A1* | 9/2005 | Nakasuji et al. | 438/14 |
| 2006/0197037 A1* | 9/2006 | Purser et al. | 250/492.21 |
| 2008/0149856 A1* | 6/2008 | Low | 250/492.21 |
| 2009/0314964 A1* | 12/2009 | Aoki | 250/492.21 |
| 2010/0006779 A1* | 1/2010 | Aoki | 250/492.21 |
| 2010/0044595 A1* | 2/2010 | Henley et al. | 250/492.21 |
| 2011/0124186 A1* | 5/2011 | Renau et al. | 438/513 |

FOREIGN PATENT DOCUMENTS

| | | |
|---|---|---|
| KR | 1020020056714 A | 7/2002 |
| KR | 1020060104847 A | 10/2006 |
| KR | 1020080062212 A | 7/2008 |
| KR | 1020090049056 A | 5/2009 |
| WO | WO 0195262 A1 * | 12/2001 |

* cited by examiner

ION IMPLANTATION SYSTEM AND ION IMPLANTATION METHOD USING THE SAME

CLAIM OF PRIORITY

This application makes reference to, incorporates the same herein, and claims all benefits accruing under 35 U.S.C. §119 from an application for ION IMPLANTATION SYSTEM AND ION IMPLANTATION METHOD USING THE SAME earlier filed in the Korean Intellectual Priority Office Korean Intellectual Priority Office on 21 Oct. 2010 and there duly assigned Serial No. 10-2010-0103059.

BACKGROUND OF THE INVENTION

1. Field of the Invention

The present invention relates to an ion implantation system and an ion implantation method using the same.

2. Description of the Related Art

In flat panel display apparatuses such as organic light emitting display apparatuses and liquid crystal display apparatuses, a thin film transistor is used as a driving circuit. In particular, in an active organic light emitting display apparatus, a thin film transistor is formed on a substrate and an organic electroluminescent device is formed on the thin film transistor.

Currently, ion implantation apparatuses for implanting ions to form a semiconductor device such as a thin film transistor are used. An ion implantation apparatus includes an ion source unit for emitting ions into a chamber, electrode units, and other elements. The ion source unit ionizes gases into a plasma state to generate ions for implantation into a substrate or a wafer.

The ions generated by the ion source unit are accelerated by the electrode units. If a predetermined voltage is applied to the electrode units, the ions emitted from the ion source unit are accelerated, and proceed toward and are implanted into the substrate.

SUMMARY OF THE INVENTION

The present invention provides an ion implantation system capable of implanting ions into a large substrate and reducing manufacturing costs, and an ion implantation method using the same.

According to an aspect of the present invention, there is provided an ion implantation system for implanting ions into a substrate, the ion implantation system including a plurality of ion implantation assemblies arranged in a line to implant ions into the substrate, and a transfer assembly including a passage through which the substrate is moved, the transfer assembly to move the substrate through the passage, wherein each of the plurality of ion implantation assemblies implants ions into a partial region of the substrate, wherein, in the passage, the substrate is implanted with ions by the plurality of ion implantation assemblies while moving in a first direction, and is also implanted with ions by the plurality of ion implantation assemblies while moving in a second direction opposite to the first direction after moving in the first direction, and wherein the transfer assembly further includes a plurality of process chambers respectively connected to the plurality of ion implantation assemblies and to implant ions into the substrate, a return chamber to change a translational direction of the substrate, a holder to support the substrate, a first transfer guide to provide a path for moving the holder supporting the substrate through the process chambers in the first direction and a second transfer guide to provide a path for moving the holder supporting the substrate through the process chambers in the second direction.

The path in the first direction may be different from the path in the second direction, and the paths may be parallel to each other. A distance from the plurality of ion implantation assemblies to the path in the first direction may be different from a distance from the plurality of ion implantation assemblies to the path in the second direction. A total amount of ions implanted into the substrate may be a sum of a first implantation amount of ions implanted while the substrate moves in the first direction and a second implantation amount of ions implanted while the substrate moves in the second direction. The first and second implantation amounts may be the same. The return chamber to move the holder supporting the substrate from the first transfer guide to the second transfer guide. The first transfer guide may allow the holder supporting the substrate to be transferred from the first chamber to the return chamber, and the second transfer guide may allow the holder supporting the substrate to be transferred from the return chamber to the first chamber. The transfer assembly may also include a first chamber through which the substrate is initially loaded into the transfer assembly and is unloaded to an outside of the transfer assembly. The transfer assembly may also include a second chamber arranged between the first chamber and the plurality of process chambers to maintain a vacuum state upon the substrate being transferred from the first chamber. The ion implantation system may also include a robot arm to supply the substrate into the transfer assembly and to receive the substrate from the transfer assembly. The robot arm may load and unload the substrate into and from the transfer assembly, the robot arm may being arranged on a same side of the transfer assembly as the plurality of ion implantation assemblies. The robot arm may load and unload the substrate into and from the transfer assembly, the robot arm may be arranged on an opposite side of the transfer assembly from the plurality of ion implantation assemblies. The robot arm may load the substrate into the transfer assembly by tilting the substrate to have an acute angle to a ground surface. The ion implantation system may also include a Faraday unit arranged within the transfer assembly to measure an amount of ions emitted from one of plurality of ion implantation assemblies. The ion implantation system may also include a slit arranged in a side surface of each of the plurality of process chambers to allow ions emitted from the plurality of ion implantation assemblies to pass into the transfer assembly.

The plurality of ion implantation assemblies may include a first ion implantation assembly and a second ion implantation assembly, wherein the plurality of process chambers comprise a first process chamber and a second process chamber, wherein the first ion implantation assembly is connected to the first process chamber, the first ion implantation assembly to emits ions into the first process chamber, and wherein the second ion implantation assembly is connected to the second process chamber, the second ion implantation assembly to emits ions into the second process chamber. The first ion implantation assembly may emit ions toward a lower portion of the substrate, and wherein the second ion implantation assembly may emit ions toward an upper portion of the substrate. The first direction may be a direction from the first process chamber toward the second process chamber and the second direction may be a direction from the second process chamber toward the first process chamber. A lower portion of the substrate may be implanted with ions emitted by the first ion implantation assembly and an upper portion of the substrate may be implanted with ions emitted by the second ion implantation assembly while the substrate is transferred in the first direction, and the upper portion of the substrate may be implanted with ions emitted by the second ion implantation assembly and the lower portion of the substrate may be implanted with ions emitted by the first ion implantation assembly while the substrate is transferred in the second direction. The first process chamber may be connected to the first ion implantation assembly, and may include a first slit through which ions generated by the first ion implantation assembly pass, and the second process chamber may be connected to the second ion implantation assembly, and may include a second slit through which ions generated by the second ion implantation assembly pass. The first slit may be arranged to correspond to the lower portion of the substrate, and the second slit may be arranged to correspond to the upper portion of the substrate.

Each of the first and second ion implantation assemblies may include an ion supply unit to generate ions by ionizing a gas received from an outside of the ion implantation system, a mass spectrometry unit to divide ions according to mass and a ion beam deflection unit to accelerate the ions divided by the mass spectrometry unit. The first and second ion implantation assemblies may be arranged symmetrically with respect to a direction that ions are emitted. The substrate may be divided into a plurality of implantation regions corresponding to the plurality of ion implantation assemblies, and each of the implantation regions may be implanted with ions by a corresponding one of the plurality of ion implantation assemblies. The implantation regions may include a lower portion and an upper portion of the substrate arranged in a direction perpendicular to a direction in which the plurality of ion implantation assemblies are arranged. While the substrate is being transferred, one of the lower implantation region and the upper implantation region of the substrate is first implanted with ions, and then another of the lower implantation region and the upper implantation region of the substrate is implanted with ions. The plurality of ion implantation assemblies may emit ions into the transfer assembly at different heights. The plurality of ion implantation assemblies may be aligned in parallel at different heights corresponding to the implantation regions of the substrate.

The ion implantation system may also include a plurality of supporting members having different heights are arranged under ones of the plurality of ion implantation assemblies to maintain the plurality of ion implantation assemblies at different heights. The plurality of ion implantation assemblies may emit ion beams at different heights due to a difference in heights of the supporting members. According to a transfer direction of the substrate, the supporting members may be sequentially aligned from a supporting member having one of a smallest height and a largest height to another supporting member having another of a smallest height and a largest height. The plurality of ion implantation assemblies may be aligned to alternate with each other between neighboring ion implantation assemblies. The plurality of ion implantation assemblies may include a plurality of upper ion implantation assemblies and a plurality of lower ion implantation assemblies, wherein the plurality of upper and lower ion implantation assemblies may be aligned to alternate with each other between neighboring ion implantation assemblies, and wherein the plurality of upper ion implantation assemblies may be arranged at a greater height than the plurality of lower ion implantation assemblies. The plurality of upper ion implantation assemblies may implant ions into an upper portion of the substrate, and wherein the plurality of lower ion implantation assemblies may implant ions into a lower portion of the substrate.

According to another aspect of the present invention, there is provided an ion implantation method, including transferring a substrate into a transfer assembly of an ion implantation assembly, implanting a first region of the substrate with ions while the substrate is being transferred in a first direction, implanting a second region of the substrate with ions while the substrate is being transferred in the first direction, changing a translational direction of the substrate from the first direction to a second direction opposite to the first direction, implanting the second region of the substrate with ions while the substrate is being transferred in the second direction and implanting the first region of the substrate with ions while the substrate is being transferred in the second direction.

The substrate may be transferred in the first and second directions on different paths. The substrate may move through the transfer assembly in the first and second directions. The transfer assembly may include a first process chamber, a second process chamber, and a return chamber arranged in a line. The first region of the substrate may be implanted with ions while the substrate passes through the first process chamber, and wherein the second region of the substrate may be implanted with ions while the substrate passes through the second process chamber. The first region of the substrate may be a lower portion of the substrate and wherein the second region of the substrate may be an upper portion of the substrate.

BRIEF DESCRIPTION OF THE DRAWINGS

A more complete appreciation of the invention, and many of the attendant advantages thereof, will be readily apparent as the same becomes better understood by reference to the following detailed description when considered in conjunction with accompanying drawings in which like reference symbols indicate the same or similar components, wherein.

DETAILED DESCRIPTION OF THE INVENTION

Figure 1A:
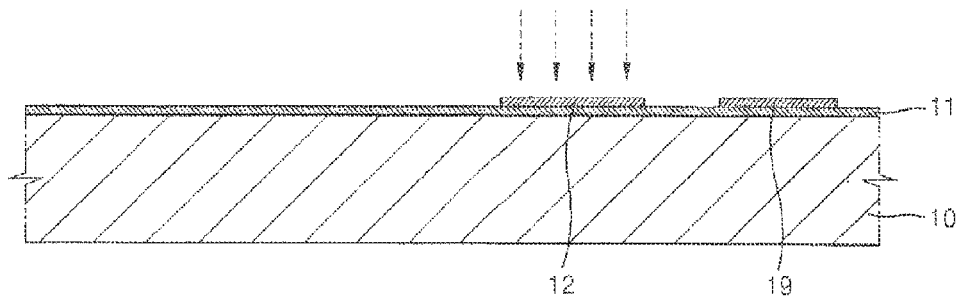
FIGS. 1A through 1C are cross-sectional views for describing a process of manufacturing a thin film transistor for driving a pixel in an active-matrix-type organic light emitting display apparatus.

While exemplary embodiments of the invention are susceptible to various modifications and alternative forms, specific embodiments thereof are shown by way of example in the drawings and will herein be described in detail. It should be understood, however, that there is no intent to limit exemplary embodiments of the invention to the particular forms disclosed, but conversely, exemplary embodiments of the invention are to cover all modifications, equivalents, and alternatives falling within the spirit and scope of the invention. In the following description of the present invention, a detailed description of known functions and configurations incorporated herein will be omitted when it may make the subject matter of the present invention unclear.

Before describing an ion implantation system and an ion implantation method according to embodiments of the present invention, the structure of a thin film transistor included in an active-matrix-type organic light emitting display apparatus for performing an ion implanting process will now be described.

Figure 1B:
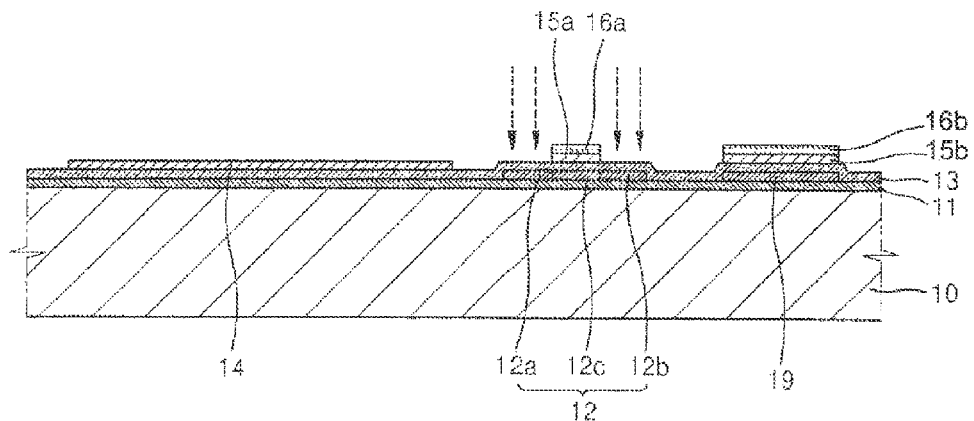
Figure 1C:
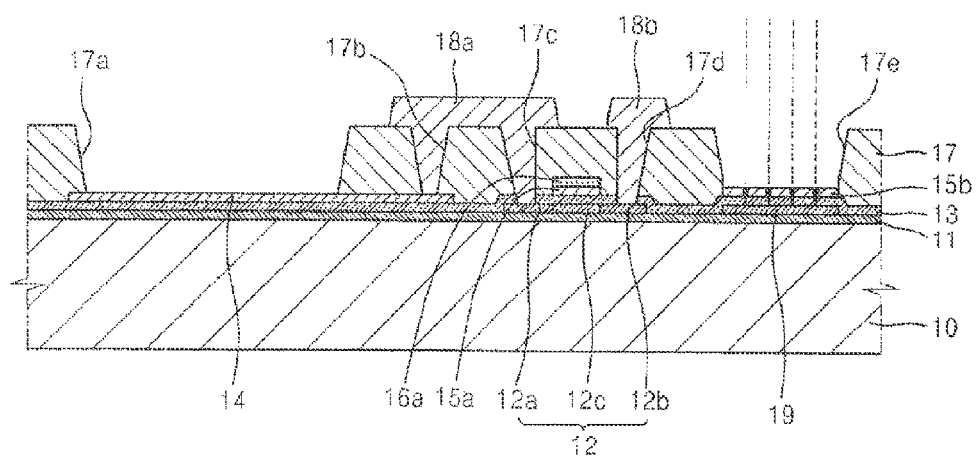

Turning now to FIGS. 1A through 1C, FIGS. 1A through 1C are cross-sectional views for describing a process of manufacturing a thin film transistor for driving a pixel in an active-matrix-type organic light emitting display apparatus. Referring now to FIG. 1A, FIG. 1A is a cross-sectional view showing a channel doping operation in the thin film transistor manufacturing process. As illustrated in FIG. 1A, a buffer layer 11 is formed on a substrate 10, and an active layer 12 and a lower electrode 19 of a capacitor are formed on the buffer layer 11.

Both the active layer 12 and the lower electrode 19 of the capacitor are formed by forming a semiconductor layer on the buffer layer 11 and then patterning the semiconductor layer. The semiconductor layer may be made out of amorphous silicon or polysilicon. Accordingly, the active layer 12 and the lower electrode 19 of the capacitor are made out of amorphous silicon or polysilicon. An ion dopant may be implanted into the active layer 12. As a result, a Vth shift effect may occur.

Referring now to FIG. 1B, FIG. 1B is a cross-sectional view showing a source and drain doping operation in the thin film transistor manufacturing process. Referring to FIG. 1B, a first insulating layer 13 is stacked on the structure illustrated in FIG. 1A, and a pixel electrode 14, first and second gate electrodes 15a and 16a of the thin film transistor, and first and second upper electrodes 15b and 16b of the capacitor are formed on the first insulating layer 13.

The first and second gate electrodes 15a and 16a of the thin film transistor, and the first and second upper electrodes 15b and 16b of the capacitor may be formed by sequentially stacking a transparent conductive layer and a metal layer on the first insulating layer 13, and then patterning the transparent conductive layer and the metal layer.

Ion impurities are doped into the active layer 12 by using the first and second gate electrodes 15a and 16a as a self-alignment mask. As a result, the active layer 12 includes source and drain regions 12a and 12b doped with the ion impurities, and a channel region 12c between the source and drain regions 12a and 12b that remains undoped.

Referring now to FIG. 1C, FIG. 1C is a cross-sectional view showing a lower electrode doping operation of the capacitor in the thin film transistor manufacturing process. Referring to FIG. 1C, a second insulating layer 17 is formed on the structure illustrated in FIG. 1B, and then first and second openings 17a and 17b for exposing the pixel electrode 14, first and second contact holes 17c and 17d for respectively exposing the source and drain regions 12a and 12b of the thin film transistor, and a third opening 17e for exposing the first upper electrode 15b of the capacitor are formed on the second insulating layer 17. After that, source and drain electrodes 18a and 18b respectively contacting the source and drain regions 12a and 12b of the active layer 12 are formed. Then, ion impurities are doped into the lower electrode 19 of the capacitor. As such, the lower electrode 19 of the capacitor may have an increased conductivity, may form a metal-insulator-metal (MIM) capacitor together with the first upper electrode 15b, and thus may increase the capacity of the capacitor.

With reference to the description above, an ion implantation system according to an embodiment of the present invention may be used in doping the source and drain regions 12a and 12b of the active layer 12, and in doping the lower electrode 19 of the capacitor.

Figure 2:
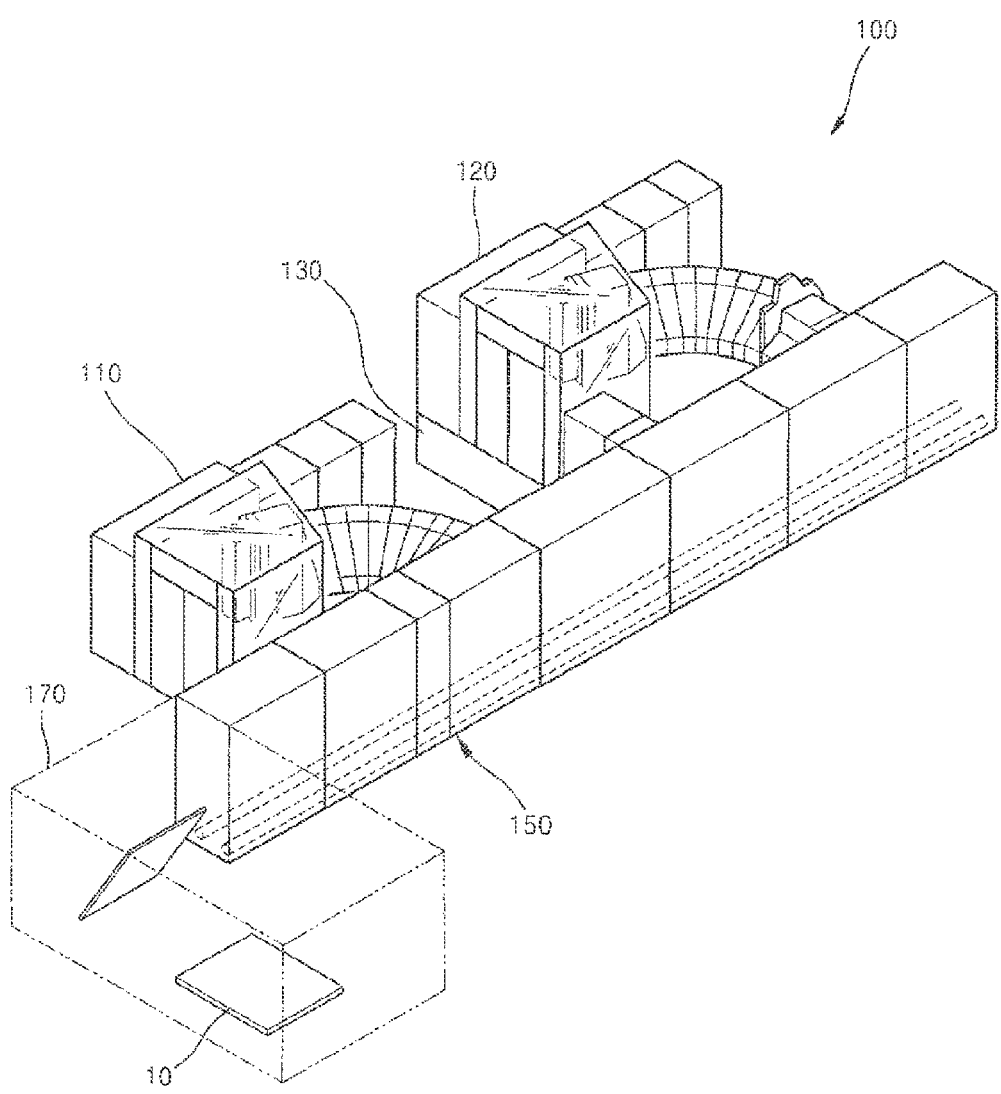
FIG. 2 is a perspective view of an ion implantation system according to a first embodiment of the present invention.
Figure 3:
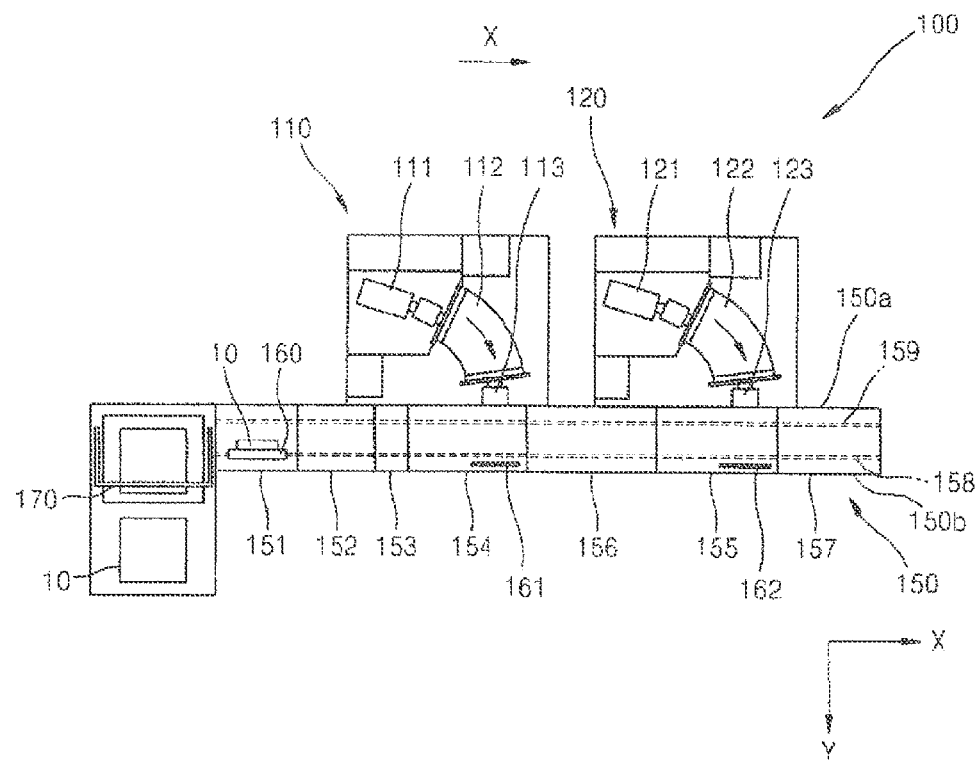
FIG. 3 is a plan view of the ion implantation system illustrated in FIG. 2.

Turning now to FIGS. 2 and 3, FIG. 2 is a perspective view of an ion implantation system 100 according to a first embodiment of the present invention and FIG. 3 is a plan view of the ion implantation system 100 illustrated in FIG. 2. The ion implantation system 100 may include first and second ion implantation assemblies 110 and 120, a transfer assembly 150, and a robot arm 170.

The ion implantation system 100 may include a plurality of ion implantation assemblies. For example, as illustrated in FIGS. 2 and 3, the ion implantation system 100 may include two ion implantation assemblies, i.e., the first and second ion implantation assemblies 110 and 120, however the present invention is not limited thereto as the ion implantation system 100 may instead include three or more ion implantation assemblies.

The first and second ion implantation assemblies 110 and 120 may generate ions and may emit the ions into the transfer assembly 150. The first and second ion implantation assemblies 110 and 120 may respectively include ion supply units 111 and 121, mass spectrometers 112 and 122, and ion beam deflection units 113 and 123. The ion supply units 111 and 121 generate ions by Ionizing a gas received from outside the ion implantation system 100. In general, cations to be used as a dopant may be, for example, $B^+$, $P^+$, $As^+$, or $Sb^+$. In order to reduce harm caused by an emission of source gas, a material for forming a dopant may be diluted with hydrogen (H) gas. As such, in general, a source gas for supplying atoms of the dopant may be, for example, $B_2H_6$, $BF_3$, $PH_3$, or $AsH_3$.

Each of the ion supply units 111 and 121 may include a filament (not shown). If a high current flows through the filament, plasma is formed around the filament. If active electrons and molecules of the source gas collide with each other due to the energy of the plasma, cations to be used as a dopant may be generated. The ion supply units 111 and 121 may collect the generated cations to form ion beams.

The mass spectrometers 112 and 122 select certain ions by using a difference in mass from among the ions generated by the ion supply units 111 and 121. Each of the mass spectrometers 112 and 122 includes a spectrometer magnet (not shown) having a refraction angle of for example, 90°, and the magnetic field of the spectrometer magnet provides a force for deflecting an ion beam including impurities or various cations, to follow a curved orbit. The ions are spread according to mass units of atoms of the ions. Ions having a relatively large mass in comparison to the intensity of a given magnetic field are curved less than ions having a relatively small mass. The radius of curvature of the curved orbit is determined according to the intensity of the magnetic field of the spectrometer magnet, and only ions having a desired mass may reach and pass through a slit at an end of the spectrometer magnet by adjusting the intensity of the magnetic field of the spectrometer magnet.

The ions selected by the mass spectrometers 112 and 122 may be accelerated or decelerated by an acceleration apparatus (not shown). When cations move relatively fast, the cations may have relatively high kinetic energy and may be deeply implanted into a substrate 10 when they collide with a surface of the substrate 10. The acceleration apparatus forms an electric field for providing additional energy to the ions selected by the mass spectrometers 112 and 122. Cations have positive charges, and thus are pulled toward an electric field having a negative polarity. An acceleration voltage is applied to form the electric field having a negative polarity and, if the intensity of the electric field is increased, cations move faster. On the other hand, if a deceleration voltage is applied by changing the polarity of the electric field, the ions selected by the mass spectrometers 112 and 122 may be decelerated.

The ion beam deflection units 113 and 123 may focus the ions accelerated or decelerated by the acceleration apparatus, and may scan the surface of the substrate 10 by deflecting the focused ions while the substrate moves through first and second process chambers 154 and 155 of the transfer assembly 150.

The first and second ion implantation assemblies 110 and 120 may be aligned in a line and may be connected to the transfer assembly 150. In particular, the first ion implantation assembly 110 may be connected to the first process chamber 154 of the transfer assembly 150, and the second ion implantation assembly 120 may be connected to the second process chamber 155 of the transfer assembly 150. The first ion implantation assembly 110 may be connected to a first slit 154a (see FIG. 4) of the first process chamber 154, and ions generated by the first ion implantation assembly 110 may be emitted into the first process chamber 154 through the first slit 154a. Also, the second ion implantation assembly 120 may be connected to a second slit 155a (see FIG. 4) of the second process chamber 155, and ions generated by the second ion implantation assembly 120 may be emitted into the second process chamber 155 through the second slit 155a.

Figure 4:
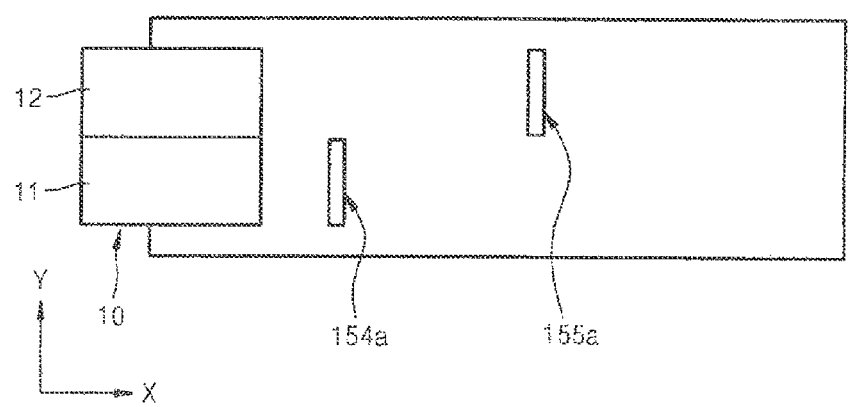
FIG. 4 is a schematic diagram showing the alignment of a substrate and first and second slits in the ion implantation system illustrated in FIGS. 2 and 3.

Referring now to FIG. 4, the first and second ion implantation assemblies 110 and 120 may implant ions into different regions of the substrate 10, e.g., first and second implantation regions 11 and 12. That is, the substrate 10 may be divided into a plurality of implantation regions corresponding to the number of ion implantation assemblies included in the ion implantation system 100. For example, if the ion implantation system 100 includes the first and second ion implantation assemblies 110 and 120 as illustrated in FIGS. 2 and 3, the substrate 10 may be divided into the first and second implantation regions 11 and 12 as illustrated in FIG. 4. Alternatively, if the ion implantation system 100 includes three or more ion implantation assemblies, the substrate 10 may be divided into three or more implantation regions.

The first and second implantation regions 11 and 12 may be formed on the substrate 10 in a direction (Y direction) perpendicular to a direction (X direction) in which the first and second ion implantation assemblies 110 and 120 are aligned. That is, the first implantation region 11 may be a lower portion of the substrate 10, and the second implantation region 12 may be an upper portion of the substrate 10. Alternatively, the first implantation region 11 may instead be the upper portion of the substrate 10, and the second implantation region 12 may be the lower portion of the substrate 10.

The first implantation region 11 (the lower portion) of the substrate 10 may be implanted with ions by the first ion implantation assembly 110, and the second implantation region 12 (the upper portion) of the substrate 10 may be implanted with ions by the second ion implantation assembly 120. The substrate 10 is supported by a holder 160 and is implanted with ions while moving through the transfer assembly 150. In more detail, the substrate 10 is loaded into a first chamber 151 by the robot arm 170, is supported by the holder 160, and is transferred through the transfer assembly 150 along a first or second transfer guide 158 or 159. Initially, the substrate 10 departs from the first chamber 151 and is transferred through the first and second process chambers 154 and 155. While the substrate 10 is transferred through the first process chamber 154, ions emitted from the first ion implantation assembly 110 are implanted into the first implantation region 11 of the substrate 10. After that, the substrate 10 is transferred to the second process chamber 155 and, while the substrate 10 is transferred through the second process chamber 155, ions emitted from the second ion implantation assembly 120 are implanted into the second implantation region 12 of the substrate 10.

Also, the substrate 10 is transferred from the second process chamber 155 to a return chamber 157 and then is transferred back to the first chamber 151 sequentially through the second and first process chambers 155 and 154. While the substrate 10 is transferred is sequentially through the second and first process chambers 155 and 154 on the way back to the first chamber 151, the second and first implantation regions 12 and 11 are implanted with ions by the second and first ion implantation assemblies 120 and 110, respectively. The ion implantation process of the substrate 10 will be described later.

As illustrated in FIG. 4, the first slit 154a may be formed to correspond to the first implantation region 11 of the substrate 10, and the second slit 155a may be formed to correspond to the second implantation region 12 of the substrate 10. That is, the first and second slits 154a and 155a are located at different heights. For example, as illustrated in FIG. 4, the second slit 155a may be arranged higher than the first slit 154a. In order to emit ions from the second slit 155a, the second ion implantation assembly 120 is disposed at a higher position than the first ion implantation assembly 110. According to an embodiment of the present invention, a supporting member 130 (see FIG. 2) may be disposed under the second ion implantation assembly 120 so that second ion implantation assembly 120 may be higher than first ion implantation assembly 110 so that ions emitted from second ion implantation assembly 120 may pass through second slit 155a.

As illustrated in FIG. 3, the transfer assembly 150 provides a passage through which the substrate 10 moves. The transfer assembly 150 may include the first chamber 151, a second chamber 152, a gate valve 153, the first process chamber 154, the second process chamber 155, a third chamber 156, the return chamber 157, the first transfer guide 158, the second transfer guide 159, and the holder 160.

The first chamber 151 loads the substrate 10 from an outside of the ion implantation system 100 into the transfer assembly 150, or unloads the substrate 10 from the transfer assembly 150 to an outside of the ion implantation system 100. If the substrate 10 is loaded into the first chamber 151, the substrate 10 is supported by the holder 160 and is transferred through the second chamber 152, the first process chamber 154, third chamber 156, the second process chamber 155, and the return chamber 157 along the first transfer guide 158. Also, if the substrate 10 is transferred to the return chamber 157, the holder 160 supporting the substrate 10 moves from the first transfer guide 158 to the second transfer guide 159, and holder supporting the substrate 10 is transferred through the second process chamber 155, the third chamber 156, the first process chamber 154, the second chamber 152, and the first chamber 151 along the second transfer guide 159. The substrate 10 transferred to the first chamber 151 may be unloaded to an outside of the ion implantation system 100.

The second chamber 152 is disposed between the first chamber 151 and the first process chamber 154, and functions as a buffer in which the substrate 10 transferred from the first chamber 151 or the substrate 10 transferred from the first process chamber 154 is on standby. The second chamber 152 is maintained in a vacuum state.

The substrate 10 transferred from the second chamber 152 may be transferred to the first process chamber 154 through the gate valve 153. The first process chamber 154 may be connected to the first ion implantation assembly 110. The first process chamber 154 may include the first slit 154a as illustrated in FIG. 4. Ions generated by the first ion implantation assembly 110 are emitted into the first process chamber 154 through the first slit 154a. The substrate 10 may be implanted with ions while being within the first process chamber 154.

The first slit 154a may be arranged to correspond to a partial region of the substrate 10. Referring to FIG. 4, the first slit 154a may be arranged to correspond to the first implantation region 11, that is, the lower portion of the substrate 10. Accordingly, an ion beam passed through the first slit 154a may be implanted into the first implantation region 11 of the substrate 10.

While the substrate 10 moves through the first process chamber 154, the first implantation region 11 may be implanted with ions. The first implantation region 11 of the substrate 10 may be implanted with ions in the first process chamber 154 while the substrate 10 moves in a first direction F (see FIG. 5), towards the return chamber 157, and may also be implanted with ions while within the first process chamber 154 while the substrate 10 is transferred in a second direction B (see FIG. 5) towards the first chamber from the return chamber 157. The ion implantation process of the substrate 10 will be described later.

The first process chamber 154 may include a Faraday unit 161. The Faraday unit 161 may measure the amount of ions emitted in the form of an ion beam from the first ion implantation assembly 110 and the uniformity of the ions emitted in the form of an ion beam.

The substrate 10 transferred from the first process chamber 154 may be transferred to the second process chamber 155 through the third chamber 156. The second process chamber 155 may be connected to the second ion implantation assembly 120. The second process chamber 155 may include the second slit 155a as illustrated in FIG. 4. Ions generated by the second ion implantation assembly 120 may be emitted into the second process chamber 155 through the second slit 155a. The substrate 10 may be implanted with ions while within the second process chamber 155.

The second slit 155a may be arranged to correspond to a partial region of the substrate 10. Referring to FIG. 4, the second slit 155a may be arranged to correspond to the second implantation region 12, that is, the upper portion of the substrate 10. Accordingly, an ion beam passing through the second slit 155a may be implanted into the second implantation region 12 of the substrate 10.

While the substrate 10 moves through the second process chamber 155, the second implantation region 12 may be implanted with ions. The second implantation region 12 of the substrate 10 may be implanted with ions in the second process chamber 155 while the substrate 10 is transferred in the first direction F, that is, from the first chamber 151 to the return chamber 157, and may also be implanted with ions in the second process chamber 155 while the substrate 10 is transferred in the second direction B, that is, from the return chamber 157 to the first chamber 151. The ion implantation of the second implantation region 12 of the substrate 10 will be described later.

The second process chamber 155 may also include a Faraday unit 162. The Faraday unit 162 may measure the amount of ions emitted in the form of an ion beam from the second ion implantation assembly 120 and the uniformity of the ions emitted in the form of an ion beam.

FIG. 4 is a schematic diagram showing the alignment of the substrate 10 and. the first and second slits 154a and 155a in the ion implantation system 100 illustrated in FIGS. 2 and 3. As described above, the first slit 154a may be formed to correspond to the first implantation region 11 of the substrate 10, and the second slit 155a may be formed to correspond to the second implantation region 12 of the substrate 10. Accordingly, the first ion implantation assembly 110 connected to the first slit 154a may implant ions into only the first implantation region 11 of the substrate 10, and the second ion implantation assembly 120 connected to the second slit 155a may implant ions into only the second implantation region 12 of the substrate 10. Because each of the first and second ion implantation assemblies 110 and 120 implants ions into only a partial region of the substrate 10, the ion implantation system 100 is able to implant ions into a relatively large substrate that may not be completely implanted with ions by a single operation by using only one ion implantation assembly. As such, a relatively large ion implantation assembly is not necessary to process large substrates, as any-size substrate may be implanted with ions by using a plurality of relatively small ion implantation assemblies according to the present invention.

The return chamber 157 may be disposed at an end of the second process chamber 155 and may change the translational direction of the substrate 10 transferred from the second process chamber 155. That is, the substrate 10 is transferred from the first chamber 151 to the return chamber 157 through the first and second process chambers 154 and 155, and once the substrate 10 reaches the return chamber 157, the translational direction of the substrate 10 is changed by the return chamber 157, and the substrate 10 is then transferred to the first chamber 151 through the second and first process chambers 155 and 154. The substrate 10 is implanted with ions while the substrate 10 is transferred in the first direction F from the first chamber 151 to the first and second process chambers 154 and 155, and is again implanted with ions while the substrate 10 is transferred in the second direction B to the first chamber 151 through the second and first process chambers 155 and 154.

Figure 5:
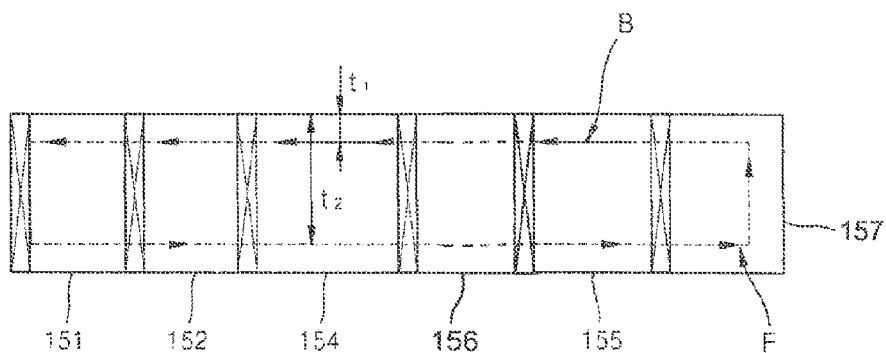
FIG. 5 is a schematic diagram showing a path of the substrate in a transfer assembly in the ion implantation system illustrated in FIGS. 2 through 4.

Turning now to FIG. 5, FIG. 5 is a schematic diagram showing a path of the substrate 10 in the transfer assembly 150 in the ion implantation system 100 illustrated in FIGS. 2 through 4. Referring to FIG. 5, the substrate 10 is transferred from the first chamber 151 toward the return chamber 157 in the first direction F, and is transferred from the return chamber 157 in the second direction B opposite to the first direction F. The second direction B is a direction from the return chamber 157 toward the first chamber 151. While the substrate 10 is transferred in the first direction F, the first implantation region 11 is implanted with ions in the first process chamber 154 and the second implantation region 12 is implanted with ions in the second process chamber 155. Also, while the substrate 10 is transferred in the second direction B, the second implantation region 12 is again implanted with ions in the second process chamber 155 and the first implantation region 11 is again implanted with ions in the first process chamber 154. That is, the substrate 10 may be implanted with ions while the substrate 10 is transferred in the first direction F, and may also be implanted with ions while the substrate 10 is transferred in the second direction B. Since the substrate 10 is implanted with ions twice as described above, the uniformity of the ions implanted over the whole substrate 10 may be improved.

A sum of a first implantation amount of ions implanted while the substrate 10 moves in the first direction F and a second implantation amount of ions implanted while the substrate 10 moves in the second direction B is a total amount of ions implanted into the substrate 10. For example, the first and second implantation amounts may be the same.

The substrate 10 may be transferred through the transfer assembly 150 along paths in the first and second directions F and B. The paths in the first and second directions F and B may not be the same path but may be different paths. That is, the paths in the first and second directions F and B may be separated from the first and second ion implantation assemblies 110 and 120 by different distances t2 and t1, respectively. In more detail, although not shown in FIG. 5, as described above in relation to FIGS. 2 through 4, the first ion implantation assembly 110 is connected to the first process chamber 154, and the second ion implantation assembly 120 is connected to the second process chamber 155. The distance t2 between the first ion implantation assembly 110 and the path in the first direction F may be greater than the distance t1 between the second ion implantation assembly 120 and the path in the second direction B. The substrate 10 may be initially transferred on the path in the first direction F separated relatively further from the first and second ion implantation assemblies 110 and 120 in comparison to the path in the second direction B, and then the translational direction of the substrate 10 may change to the second direction B in the return chamber 157. As such, since the substrate 10 in the transfer assembly 150 is transferred in the first and second directions F and B on different paths, a plurality of substrates 10 may be sequentially loaded into the transfer assembly 150 and thus a tact time for implanting ions may be improved.

In each of the first and second process chambers 154 and 155, only one substrate 10 may be implanted with ions while being transferred. That is, although the substrate 10 may be transferred through the first or second process chamber 154 or 155 in the first or second direction F or B, one substrate 10 moving in the first direction F and another substrate 10 moving in the second direction B may not be simultaneously transferred through one of the first and second process chambers 154 and 155. If one substrate 10 is transferred in the first direction F and another substrate 10 is transferred in the second direction B at the same time through one of the first and second process chambers 154 and 155, implantation of ions into the substrate 10 transferred in the first direction F is disturbed by the substrate 10 transferred in the second direction B.

With the arrangement of FIG. 5, it may be possible to implant ions from a first ion implantation assembly 110 into a first substrate 10 in first process chamber 154 and traveling in first direction F while second ion implantation assembly 120 implants ions into a second substrate 10 in second process chamber 155 and traveling in second direction B. Because the path in the second direction B is spaced apart from the path in the first direction F, it is possible to move the first substrate 10 in the first direction F to the second process chamber 155 while the second substrate 10 moves in the second direction B to the first process chamber 154 without the two substrates colliding with each other. Then, the first substrate 10 is implanted with ions from the second ion implantation assembly 120 while the second substrate 10 is implanted with ions from the first ion implantation assembly 110. Consequently, by spacing the paths of the first and second directions F and B apart from each other as in FIG. 5, it is possible to increase throughput of the ion implantation system 100.

The robot arm 170 is connected to the first chamber 151, and supplies the substrate 10 from an outside of the ion implantation system 100 into the first chamber 151, or from the first chamber 151 to an outside of the ion implantation system 100. The robot arm 170 supplies the substrate 10 into the first chamber 151 by vertically tilting the substrate 10 with respect to the ground, as illustrated in FIG. 2.

The robot arm 170 and the first and second ion implantation assemblies 110 and 120 may be disposed at opposite sides of the transfer assembly 150 as illustrated in FIG. 3. That is, the robot arm 170 may be disposed at one side 150b of the transfer assembly 150, and the first and second ion implantation assemblies 110 and 120 may be disposed at another side 150a of the transfer assembly 150.

Figure 6:
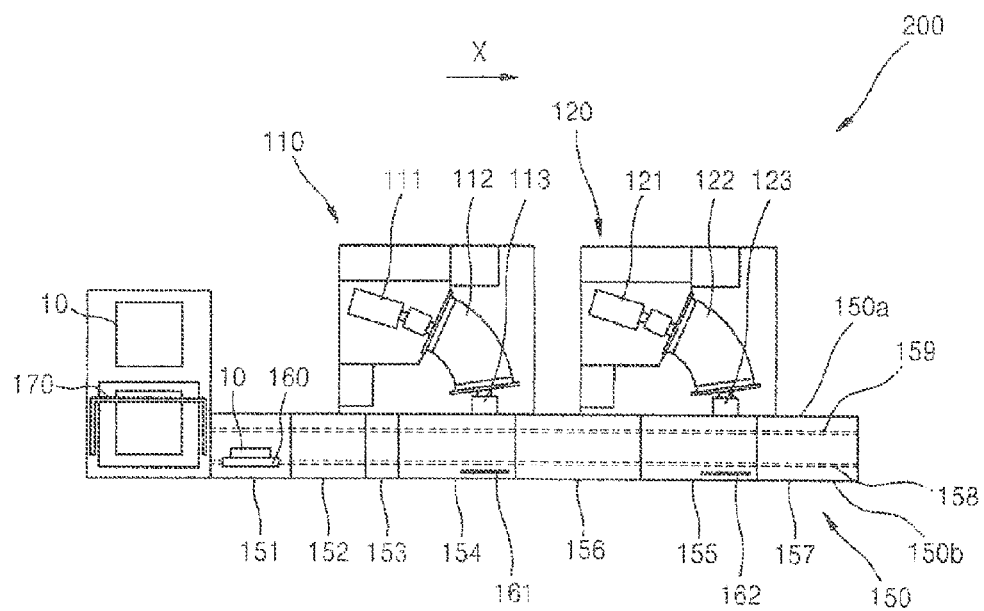
FIG. 6 is a plan view of an ion implantation system according to a second embodiment of the present invention.

Turning now to FIG. 6, FIG. 6 is a plan view of an ion implantation system 200 according to a second embodiment of the present invention. Referring to FIG. 6, the robot arm 170 and the first and second ion implantation assemblies 110 and 120 may all be disposed on a same side 150a of the transfer assembly 150. As such, a space occupied by the ion implantation system 200 may be reduced. In comparison to a case when the first and second ion implantation assemblies 110 and 120 and the robot arm 170 are disposed at opposite sides of the transfer assembly 150, if the first and second ion implantation assemblies 110 and 120 and the robot arm 170 are disposed on a same side of the transfer assembly 150, an area occupied by the ion implantation system 200 may be reduced and thus an installation cost of the ion implantation system 200 may also be reduced.

Figure 7:
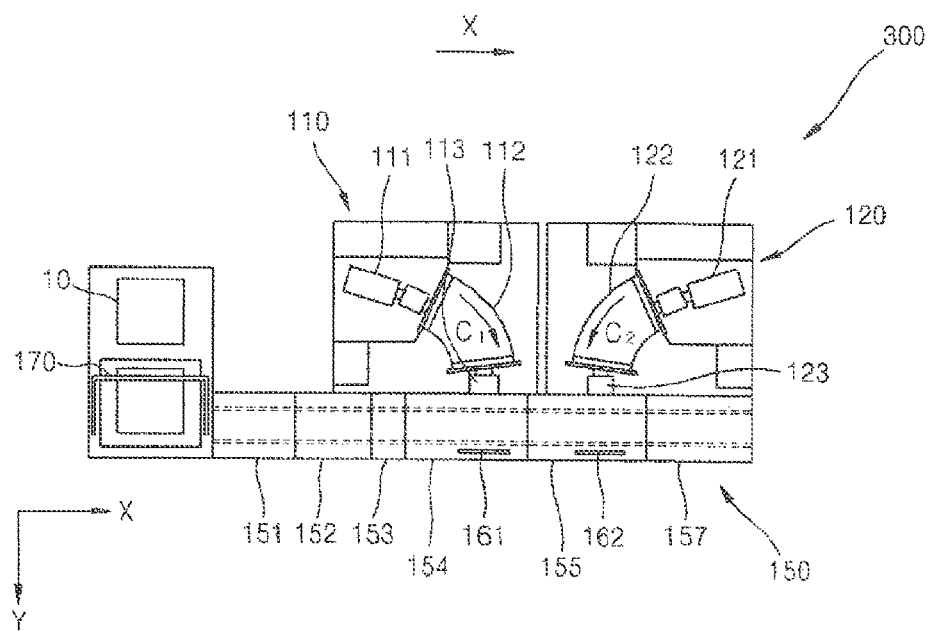
FIG. 7 is a plan view of an ion implantation system according to a third embodiment of the present invention.

Turning now to FIG. 7, FIG. 7 is a plan view of an ion implantation system 300 according to a third embodiment of the present invention. Referring to FIG. 7, the ion implantation system 300 is different from the ion implantation system 100 illustrated in FIGS. 2 and 3 in that the first and second ion implantation assemblies 110 and 120 are disposed symmetrically. That is, the first and second ion implantation assemblies 110 and 120 may be disposed symmetrically with respect to a direction (Y direction) for emitting ions. As such, an overall length of the transfer assembly 150 may be reduced. In more detail, the first and second ion implantation assemblies 110 and 120 may respectively include the ion supply units 111 and 121, the mass spectrometers 112 and 122, and the ion beam deflection units 113 and 123. Since each of the mass spectrometers 112 and 122 includes a spectrometer magnet having a refraction angle of 90° as described above in relation to FIGS. 2 and 3, if the mass spectrometer 112 of the first ion implantation assembly 110 and the mass spectrometer 122 of the second ion implantation assembly 120 are disposed asymmetrically as illustrated in FIG. 3, the ion supply unit 121 of the second ion implantation assembly 120 is disposed between the mass spectrometer 112 of the first ion implantation assembly 110 and the mass spectrometer 122 of the second ion implantation assembly 120, and thus the third chamber 156 is disposed between the first and second process chambers 154 and 155 in the transfer assembly 150. However, in the ion implantation system 300, the first and second ion implantation assemblies 110 and 120 may be disposed symmetrically with respect to the direction (Y direction) perpendicular to a direction (X direction) in which the transfer assembly 150 extends. That is, the mass spectrometers 112 and 122 are now disposed between the ion supply unit 111 of the first ion implantation assembly 110 and the ion supply unit 121 of the second ion implantation assembly 120 and are disposed symmetrically with respect to the perpendicular direction (Y direction), and thus the first and second process chambers 154 and 155 may directly contact each other without interposing a third chamber 156 therebetween. Accordingly, a manufacturing cost of the ion implantation system 300 may be reduced. Also, since an overall length of the transfer assembly 150 is reduced and thus an area occupied by the ion implantation system 300 is also reduced, a cost for building a factory that requires the ion implantation system 300 may be reduced. Also, due to the reduction in length of the transfer assembly 150 through which the substrate 10 is transferred, a tact time for an ion implantation process may be reduced and thus throughput and productivity may be improved.

Figure 8:
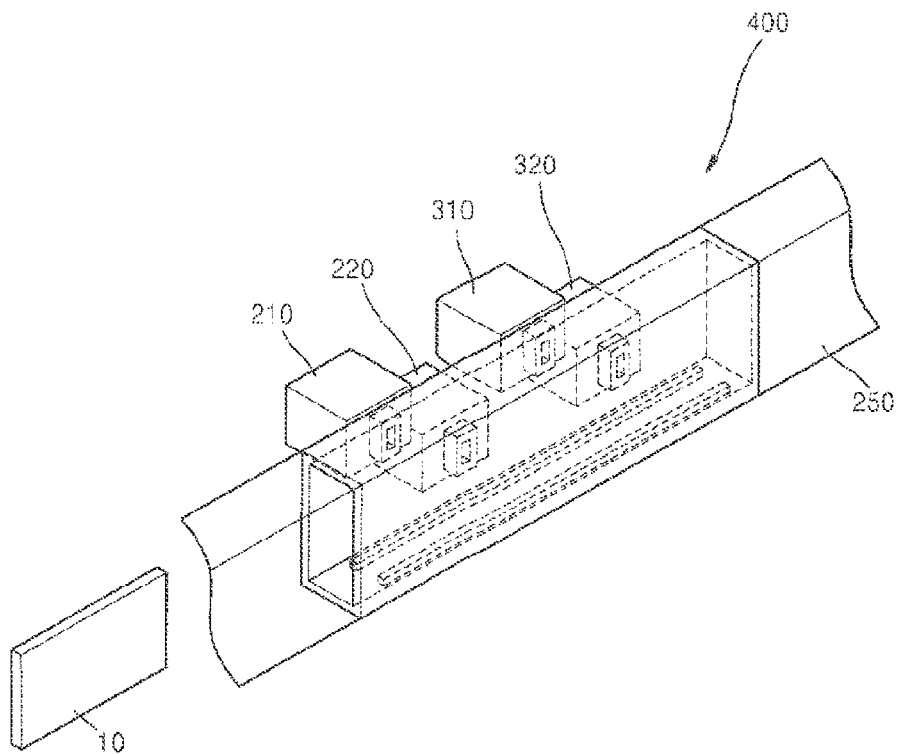
FIG. 8 is a perspective view of an ion implantation system according to a fourth embodiment of the present invention.
Figure 9:
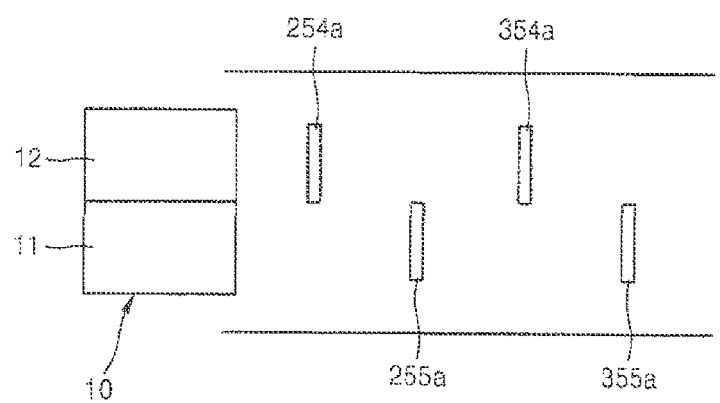
FIG. 9 is a schematic diagram showing the alignment of slits of the ion implantation system illustrated in FIG. 8.

Turning now to FIGS. 8 and 9, FIGS. 8 and 9 schematically illustrate an ion implantation system 400 according to a fourth embodiment of the present invention. In more detail, FIG. 8 is a perspective view of an ion implantation system 400 according to the fourth embodiment of the present invention and FIG. 9 is a schematic diagram showing the alignment of first through fourth slits 254a, 354a, 255a, and 355a of the ion implantation system 400 illustrated in FIG. 8.

Referring to FIG. 8, the ion implantation system 400 may include four ion implantation assemblies that are aligned in an alternate manner. For example, the ion implantation system 400 may include first and second upper ion implantation assemblies 210 and 310 and first and second lower ion implantation assemblies 220 and 320, wherein the first upper and lower ion implantation assemblies 210 and 220 are adjacent to each other and are aligned in different rows, the first lower ion implantation assembly 220 and the second upper ion implantation assembly 310 are adjacent to each other and are aligned in different rows, and the second upper and lower ion implantation assemblies 310 and 320 are adjacent to each other and are aligned in different rows. The first and second upper ion implantation assemblies 210 and 310 may implant ions into the second implantation region 12 (see FIG. 4) of the substrate 10, and the first and second lower ion implantation assemblies 220 and 320 may implant ions into the first implantation region 11 (see FIG. 4) of the substrate 10. The second implantation region 12 of the substrate 10 is the upper portion of the substrate 10, and the first implantation region 11 of the substrate 10 is the lower portion of the substrate 10.

The first and second upper ion implantation assemblies 210 and 310 are installed at an upper portion of a side wall of a transfer assembly 250 and at a predetermined height from a bottom surface of the transfer assembly 250, in order to implant ions into the second implantation region 12 of the substrate 10. Also, the first and second lower ion implantation assemblies 220 and 320 are installed at lower portion of the side wall of the transfer assembly 250, in order to implant ions into the first implantation region 11 of the substrate 10.

The first and second upper and lower ion implantation assemblies 210, 220, 310, and 320 are connected to the first through fourth slits 254a, 354a, 255a, and 355a respectively formed in the side wall of the transfer assembly 250, and ions generated by the first and second upper and lower ion implantation assemblies 210, 220, 310, and 320 are emitted into the transfer assembly 250 through the first through fourth slits 254a, 354a, 255a, and 355a. The first and second upper ion implantation assemblies 210 and 310 are respectively connected to the first and second slits 254a and 354a, and the first and second lower ion implantation assemblies 220 and 320 are respectively connected to the third and fourth slits 255a and 355a.

An ion implantation method according to an embodiment of the present invention will now be described. Initially, the substrate 10 transferred from an outside of the ion implantation system 100 is loaded into the first chamber 151 by the robot arm 170. The robot arm 170 supplies the substrate 10 into the first chamber 151 by vertically tilting the substrate 10 with respect to the ground.

Then, the substrate 10 passes through the first chamber 151, the second chamber 152, and the gate valve 153, and then reaches the first process chamber 154 along the first direction F. The substrate 10 is transferred through the first process chamber 154 in the first direction F, and ions emitted from the first ion implantation assembly 110 are implanted into one region (the first implantation region 11) of the substrate 10 while the substrate 10 is transferred through the first process chamber 154.

After that, the substrate 10 passed through the first process chamber 154 passes through the third chamber 156 and then is implanted with ions within the second process chamber 155. Another region (the second implantation region 12) of the substrate 10 is implanted with ions in the second process chamber 155. The second implantation region 12 of the substrate 10 is implanted with ions while the substrate 10 is transferred through the second process chamber 155 in the first direction F.

The substrate 10, having been passed through second process chamber 155, reaches the s return chamber 157. In the return chamber 157, the translational direction of the substrate 10 is changed from the first direction F into the second direction B. That is, the substrate 10 moves from the second process chamber 155 toward the first chamber 151.

The substrate 10, of which the translational direction is changed into the second direction B in the return chamber 157, reaches the second process chamber 155. The second implantation region 12 of the substrate 10 is implanted with ions while the substrate 10 is transferred through the second process chamber 155 in the second direction B.

Then, the substrate 10 passes through the third chamber 156 and then reaches the first process chamber 154. The first implantation region 11 of the substrate 10 is implanted with ions while the substrate 10 is transferred through the first process chamber 154 in the second direction B.

After passing through the first process chamber 154 in second direction B, substrate 10 is transferred sequentially through the gate valve 153, the second chamber 152, and the first chamber 151, and reaches the robot arm 170. The robot arm 170 unloads the substrate 10 to an outside of the ion implantation system 100.

According to the present invention, ions may be implanted into a relatively large substrate from a relatively small piece of equipment, a time for an ion implantation process may be reduced, throughput and productivity are improved, and a manufacturing cost of an ion implantation system may also be reduced.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. An ion implantation system for implanting ions into a substrate, the ion implantation system comprising:
   a plurality of ion implantation assemblies arranged along a passage implanting ions into the substrate, each of the plurality of ion implantation assemblies implanting ions into a partial region of the substrate; and
   a transfer assembly including the passage, the transfer assembly moving the substrate through the passage,
   the transfer assembly further comprising:
   a plurality of process chambers corresponding to the plurality of ion implantation assemblies and implanting ions into the substrate while the substrate is moving along a path in a first direction through the passage and while the substrate is moving along the same path in a second direction through the passage opposite to the first direction after moving in the first direction.

2. The ion implantation system of claim 1, a distance from the plurality of ion implantation assemblies to the path in the first direction is different from a distance from the plurality of ion implantation assemblies to the path in the second direction.

3. The ion implantation system of claim 1, a total amount of ions implanted into the substrate is a sum of a first implanted amount of ions while the substrate moves in the first direction and a second implanted amount of ions while the substrate moves in the second direction.

4. The ion implantation system of claim 3, the first and second implantation amounts are the same.

5. The ion implantation system of claim 1, the transfer assembly further comprising a first chamber through which the substrate is initially loaded into the transfer assembly and is unloaded to outside of the transfer assembly.

6. The ion implantation system of claim 5, the transfer assembly further comprising a second chamber arranged between the first chamber and the plurality of process chambers maintaining a vacuum state when the substrate being transferred from the first chamber.

7. The ion implantation system of claim 1, further comprising a robot arm supplying the substrate into the transfer assembly and receiving the substrate from the transfer assembly.

8. The ion implantation system of claim 7, the robot arm loading and unloading the substrate into and from the transfer assembly, the robot arm being arranged on the same side with the plurality of ion implantation assemblies in the transfer assembly.

9. The ion implantation system of claim 7, the robot arm loading and unloading the substrate into and from the transfer assembly, the robot arm being arranged on an opposite side of the transfer assembly from the plurality of ion implantation assemblies.

10. The ion implantation system of claim 7, the robot arm loading the substrate into the transfer assembly by tilting the substrate to an acute angle from a ground surface.

11. The ion implantation system of claim 1, further comprising a Faraday unit arranged within the transfer assembly measuring an amount of ions emitted from one of the plurality of ion implantation assemblies.

12. The ion implantation system of claim 1, further comprising a slit arranged in a surface of each of the plurality of process chambers, ions emitted from the plurality of ion implantation assemblies pass through the slit into the transfer assembly.

13. The ion implantation system of claim 1, the plurality of ion implantation assemblies comprising a first ion implantation assembly and a second ion implantation assembly,
the plurality of process chambers comprising a first process chamber and a second process chamber,
the first ion implantation assembly connecting to the first process chamber, the first ion implantation assembly emitting ions into the first process chamber, and
the second ion implantation assembly connecting to the second process chamber, the second ion implantation assembly emitting ions into the second process chamber.

14. The ion implantation system of claim 13,
the first ion implantation assembly emitting ions toward a portion of the substrate, and
the second ion implantation assembly emitting ions toward another portion of the substrate.

15. The ion implantation system of claim 13,
the first direction is a direction from the first process chamber toward the second process chamber, and
the second direction is a direction from the second process chamber toward the first process chamber.

16. An ion implantation system, comprising:
a plurality of ion implantation assemblies arranged along a passage and each of the plurality of ion implantation assemblies implanting ions into a partial region of a substrate;
a lower portion of the substrate is implanted with ions emitted by the first of the ion implantation assemblies and an upper portion of the substrate is implanted with ions emitted by the second of the ion implantation assemblies while the substrate is transferred along a path through the passage in a first direction, and
the upper portion of the substrate is implanted with ions emitted by the second of the ion implantation assemblies and the lower portion of the substrate is implanted with ions emitted by the first of the ion implantation assemblies while the substrate is transferred along the same path through the passage in a second direction.

17. The ion implantation system of claim 13,
the first process chamber connecting to the first ion implantation assembly, comprising a first slit and ions generated by the first ion implantation assembly pass through the slit, and
the second process chamber connecting to the second ion implantation assembly, comprising a second slit and ions generated by the second ion implantation assembly pass through the slit.

18. The ion implantation system of claim 17, the first slit is arranged to correspond to the lower portion of the substrate, and the second slit is arranged to correspond to the upper portion of the substrate.

19. The ion implantation system of claim 13, each of the first and second ion implantation assemblies comprising:
an ion supply unit generating ions by ionizing a gas received from outside of the ion implantation system;
a mass spectrometry unit dividing ions according to ionic mass; and
an ion beam deflection unit accelerating the ions divided by the mass spectrometry unit.

20. The ion implantation system of claim 13, the first and second ion implantation assemblies are arranged symmetrically with respect to a direction that the ions are emitted.

21. The ion implantation system of claim 1, the substrate is divided into a plurality of implantation regions corresponding to the plurality of ion implantation assemblies, and each of the implantation regions is implanted with ions by a corresponding one of the plurality of ion implantation assemblies.

22. The ion implantation system of claim 21, the implantation regions comprise a lower portion and an upper portion of the substrate arranged in a direction perpendicular to a direction in which the plurality of ion implantation assemblies are arranged.

23. The ion implantation system of claim 22, while the substrate is transferred, one of the lower implantation region and the upper implantation region of the substrate is first implanted with ions, and then another of the lower implantation region and the upper implantation region of the substrate is implanted with ions.

24. The ion implantation system of claim 22, the plurality of ion implantation assemblies from different locations emitting ions into the substrate moving in the transfer assembly.

25. The ion implantation system of claim 24, the plurality of ion implantation assemblies are aligned in parallel at different locations with different distances from the path, and the locations corresponding to the implantation regions of the substrate.

26. The ion implantation system of claim 25, further comprising a plurality of supporting members from different locations arranged under the plurality of ion implantation assemblies to maintain the plurality of ion implantation assemblies at different heights from the ground level.

27. The ion implantation system of claim 26, the plurality of ion implantation assemblies emitting ion beams from different locations due to a difference in distances of the supporting members from the ground level.

28. The ion implantation system of claim 26, according to a transfer direction of the substrate, the supporting members are sequentially aligned from a supporting member having one of a smallest height and a largest height to another supporting member having another one of a smallest height and a largest height.

29. The ion implantation system of claim 1, the plurality of ion implantation assemblies are aligned alternating with each other between neighboring ion implantation assemblies.

30. The ion implantation system of claim 29,
the plurality of ion implantation assemblies comprising a plurality of upper ion implantation assemblies and a plurality of lower ion implantation assemblies,
the plurality of upper and lower ion implantation assemblies are aligned alternating with each other between neighboring ion implantation assemblies, and
the plurality of upper ion implantation assemblies are arranged at a distance from the ground level greater than that of the plurality of lower ion implantation assemblies.

31. The ion implantation system of claim 30,
the plurality of upper ion implantation assemblies implant ions into an upper portion of the substrate, and
the plurality of lower ion implantation assemblies implant ions into a lower portion of the substrate.

32. An ion implantation method, comprising:
transferring a substrate into a transfer assembly of an ion implantation assembly;
implanting a first region of the substrate with ions while the substrate is being transferred along a path in a first direction;
implanting a second region of the substrate with ions while the substrate is being transferred along the same path in the first direction;
changing a translational direction of the substrate from the first direction to a second direction opposite to the first direction;
implanting the second region of the substrate with ions while the substrate is being transferred along the same path in the second direction; and
implanting the first region of the substrate with ions while the substrate is being transferred along the same path in the second direction.

33. The ion implantation method of claim 32, comprising moving the substrate through the transfer assembly in the first and second directions.

34. The ion implantation method of claim 33, the transfer assembly comprising a first process chamber, a second process chamber, and a return chamber arranged along the path.

35. The ion implantation method of claim 34,
implanting the first region of the substrate with ions while the substrate passes through the first process chamber, and
implanting the second region of the substrate with ions while the substrate passes through the second process chamber.

36. The ion implantation method of claim 32,
the first region of the substrate is a lower portion of the substrate, and
the second region of the substrate is an upper portion of the substrate.

* * * * *